(12) United States Patent
Arneson et al.

(10) Patent No.: US 7,276,388 B2
(45) Date of Patent: Oct. 2, 2007

(54) METHOD, SYSTEM, AND APPARATUS FOR AUTHENTICATING DEVICES DURING ASSEMBLY

(75) Inventors: Michael R. Arneson, Westminster, MD (US); William R. Bandy, Gambrills, MD (US)

(73) Assignee: Symbol Technologies, Inc., Holtsville, NY (US)

( * ) Notice: Subject to any disclaimer, the term of this patent is extended or adjusted under 35 U.S.C. 154(b) by 239 days.

(21) Appl. No.: 10/866,152

(22) Filed: Jun. 14, 2004

(65) Prior Publication Data

US 2005/0007252 A1    Jan. 13, 2005

Related U.S. Application Data

(60) Provisional application No. 60/477,735, filed on Jun. 12, 2003.

(51) Int. Cl.
*H01L 21/66* (2006.01)
(52) U.S. Cl. .......... 438/17; 257/E21.521; 257/E21.531
(58) Field of Classification Search .................. 438/15, 438/17–18, 22–27, 64, 106, 107, 109–111, 438/128
See application file for complete search history.

(56) References Cited

U.S. PATENT DOCUMENTS

| | | | |
|---|---|---|---|
| 3,724,737 A | 4/1973 | Bodnar | |
| 3,891,157 A | 6/1975 | Justus | |
| 3,989,575 A | 11/1976 | Davies et al. | |
| 4,346,514 A | 8/1982 | Makizawa et al. | |
| 4,480,742 A | 11/1984 | Muylle | |
| 4,925,808 A | 5/1990 | Richardson | |
| 5,256,578 A * | 10/1993 | Corley et al. ................. | 438/17 |
| 5,519,381 A | 5/1996 | Marsh et al. | |
| 5,528,222 A | 6/1996 | Moskowitz et al. | |
| 5,537,105 A | 7/1996 | Marsh et al. | |
| 5,557,280 A | 9/1996 | Marsh et al. | |

(Continued)

FOREIGN PATENT DOCUMENTS

DE        196 34 473 C2        1/1998

(Continued)

OTHER PUBLICATIONS (Laran RIFD: Web Site; WWW.laranrfid.com: "Basic Introduction to RFID Technology and its use in the Supply Chain": Jan. 2004: Date Downloaded; Dec. 13, 2005: Author; Steve Lewis).*

(Continued)

*Primary Examiner*—Michael Lebentritt
*Assistant Examiner*—Andre' Stevenson
(74) *Attorney, Agent, or Firm*—Sterne, Kessler, Goldstein & Fox P.L.L.C.

(57) ABSTRACT

Methods and systems for authenticating the operation of electronic devices, such as RFID tags are provided. In accordance with the method, a web of substrates having a plurality of devices attached thereto are received. The operation of a first set of the plurality of devices is authenticated. If it is determined that one or more devices is not operating properly, the location of each device is determined. The web of substrates is then moved incrementally to expose a second set of the plurality of devices. Each device that does not operate properly is indicated by applying ink to the substrate containing the device or by removing the device.

17 Claims, 13 Drawing Sheets

U.S. PATENT DOCUMENTS

| | | |
|---|---|---|
| 5,564,888 A | 10/1996 | Doan |
| 5,566,441 A | 10/1996 | Marsh et al. |
| 5,585,193 A | 12/1996 | Josephy et al. |
| 5,837,349 A | 11/1998 | Van Erden et al. |
| 5,904,546 A | 5/1999 | Wood et al. |
| 5,946,198 A | 8/1999 | Hoppe et al. |
| 5,982,284 A | 11/1999 | Baldwin et al. |
| 6,018,299 A | 1/2000 | Eberhardt |
| 6,082,660 A | 7/2000 | Meyer |
| 6,091,332 A | 7/2000 | Eberhardt et al. |
| 6,145,901 A | 11/2000 | Rich |
| 6,147,662 A | 11/2000 | Grabau et al. |
| 6,165,386 A | 12/2000 | Endo et al. |
| 6,206,292 B1 | 3/2001 | Robertz et al. |
| 6,262,692 B1 | 7/2001 | Babb |
| 6,265,977 B1 | 7/2001 | Vega et al. |
| 6,281,795 B1 | 8/2001 | Smith et al. |
| 6,322,903 B1 | 11/2001 | Siniaguine et al. |
| 6,416,608 B1 | 7/2002 | Mynott et al. |
| 6,451,154 B1 | 9/2002 | Grabau et al. |
| 6,514,790 B1 | 2/2003 | Plettner et al. |
| 6,555,400 B2 * | 4/2003 | Farnworth et al. ............ 438/17 |
| 6,606,247 B2 | 8/2003 | Credelle et al. |
| 6,608,370 B1 | 8/2003 | Chen et al. |
| 6,692,978 B2 * | 2/2004 | Tandy et al. .................. 438/26 |
| 6,731,353 B1 | 5/2004 | Credelle et al. |
| 2002/0050591 A1 * | 5/2002 | Tandy ......................... 257/48 |
| 2002/0053735 A1 * | 5/2002 | Neuhaus et al. ............ 257/728 |
| 2003/0136503 A1 | 7/2003 | Green et al. |
| 2004/0192011 A1 * | 9/2004 | Roesner ...................... 438/460 |
| 2005/0026315 A1 * | 2/2005 | Cowles et al. ................ 438/18 |
| 2005/0176170 A1 * | 8/2005 | Detig ......................... 438/106 |

FOREIGN PATENT DOCUMENTS

| | | |
|---|---|---|
| DE | 198 05 031 C2 | 8/1999 |
| DE | 198 40 226 A1 | 3/2000 |
| FR | 2 775 533 | 9/1999 |
| WO | WO 00/14733 A1 | 3/2000 |
| WO | WO 01/54058 A1 | 7/2001 |
| WO | WO 01/61646 A1 | 8/2001 |
| WO | WO 01/95241 A1 | 12/2001 |
| WO | WO 02/37414 A1 | 5/2002 |
| WO | WO 02/49093 A1 | 6/2002 |
| WO | WO 02/082368 A1 | 10/2002 |

OTHER PUBLICATIONS

English Language Abstract for DE 19634473, published Jan. 22, 1998, 1 page.

English Language Abstract for DE 19805031, published Aug. 19, 1999, 1 page.

English Language Abstract for DE 19840226, published Mar. 16, 2000, 1 page.

English Language Abstract for FR 2775533, published Sep. 3, 1999, 1 page.

Sarma, Sanjay, "White Paper-Towards the 5¢ Tag", Auto-ID Center, Published Nov. 1, 2001, pp. 1-19.

* cited by examiner

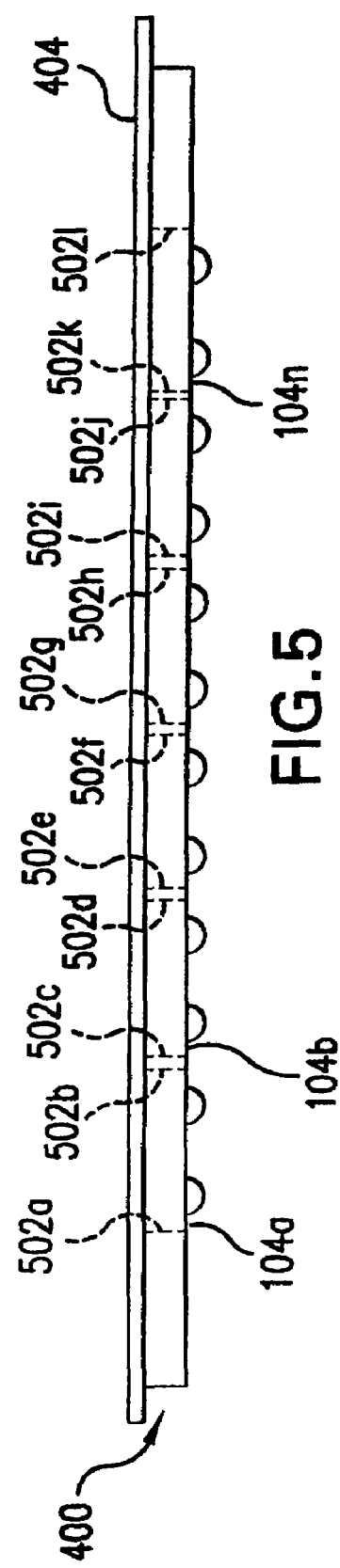

METHOD, SYSTEM, AND APPARATUS FOR AUTHENTICATING DEVICES DURING ASSEMBLY

CROSS-REFERENCE TO RELATED APPLICATIONS

This application claims the benefit of U.S. Provisional Application No. 60/477,735, filed Jun. 12, 2003, which is herein incorporated by reference in its entirety.

The following applications of common assignee are related to the present application, have the same filing date as the present application, and are herein incorporated by reference in their entireties:

"Method and Apparatus For Expanding A Semiconductor Wafer," U.S. Ser. No. 10/866,148;

"Method, System, and Apparatus for Transfer of Dies Using A Die Plate Having Die Cavities," U.S. Ser. No. 10/866,150;

"Method, System, and Apparatus For Transfer Of Dies Using a Die Plate," U.S. Ser. No. 10/866,253;

"Method, System, and Apparatus For Transfer of Dies Using a Pin Plate," U.S. Ser. No. 10/866,159;

"Method, System, and Apparatus For High Volume Transfer of Dies," U.S. Ser. No. 10/866,149; and "Method, System, and Apparatus For High Volume Assembly Of Compact Discs And Digital Video Discs Incorporating Radio Frequency Identification Tag Technology," U.S. Ser. No. 10/866,151.

The following applications of common assignee are related to the present application, and are herein incorporated by reference in their entireties:

"Method and Apparatus for High Volume Assembly of Radio Frequency Identification Tags," U.S. Provisional App. No. 60/400,101, filed Aug. 2, 2002;

"Method and Apparatus for High Volume Assembly of Radio Frequency Identification Tags," Ser. No. 10/322,467, filed Dec. 19, 2002;

"Multi-Barrel Die Transfer Apparatus and Method for Transferring Dies Therewith," Ser. No. 10/322,718, filed Dec. 19, 2002;

"Die Frame Apparatus and Method of Transferring Dies Therewith," Ser. No. 10/322,701, filed Dec. 19, 2002;

"System and Method of Transferring Dies Using an Adhesive Surface," Ser. No. 10/322,702, filed Dec. 19, 2002; and "Method and System for Forming a Die Frame and for Transferring Dies Therewith," Ser. No. 10/429,803, filed May 6, 2003.

BACKGROUND OF THE INVENTION

1. Field of the Invention

The present invention relates generally to the assembly of electronic devices. More particularly, the present invention relates to the transfer of dies from wafers to substrates, including substrates of radio frequency identification (RFID) tags.

2. Related Art

Pick and place techniques are often used to assemble electronic devices. Such techniques involve a manipulator, such as a robot arm, to remove integrated circuit (IC) dies from a wafer and place them into a die carrier. The dies are subsequently mounted onto a substrate with other electronic components, such as antennas, capacitors, resistors, and inductors to form an electronic device.

Pick and place techniques involve complex robotic components and control systems that handle only one die at a time. This has a drawback of limiting throughput volume. Furthermore, pick and place techniques have limited placement accuracy, and have a minimum die size requirement.

One type of electronic device that may be assembled using pick and place techniques is an RFID "tag." An RFID tag may be affixed to an item whose presence is to be detected and/or monitored. The presence of an RFID tag, and therefore the presence of the item to which the tag is affixed, may be checked and monitored by devices known as "readers."

As market demand increases for products such as RFID tags, and as die sizes shrink, high assembly throughput rates for very small die, and low production costs are crucial in providing commercially-viable products. Accordingly, what is needed is a method and apparatus for high volume assembly of electronic devices, such as RFID tags, that overcomes these limitations.

SUMMARY OF THE INVENTION

The present invention is directed to methods, systems, and apparatuses for producing one or more electronic devices, such as RFID tags, that each include a die having one or more electrically conductive contact pads that provide electrical connections to related electronics on a substrate.

According to the present invention, electronic devices are formed at much greater rates than conventionally possible. In one aspect, large quantities of dies can be transferred directly from a wafer to corresponding substrates of a web of substrates. In another aspect, large quantities of dies can be transferred from a support surface to corresponding substrates of a web of substrates. In another aspect, large quantities of dies can be transferred from a wafer or support surface to an intermediate surface, such as a die plate. The die plate may have cells formed in a surface thereof in which the dies reside. Otherwise, the dies can reside on a surface of the die plate. The dies of the die plate can then be transferred to corresponding substrates of a web of substrates.

In an aspect, a punch plate, punch roller or cylinder, or a changeable or movable material can be used to transfer dies from the die plate to substrates.

Large quantities of dies can be transferred. For example, 10s, 100s, 1000s, or more dies, or even all dies of a wafer, support surface, or die plate, can be simultaneously transferred to corresponding substrates of a web.

In one aspect, dies may be transferred between surfaces in a "pads up" orientation. When dies are transferred to a substrate in a "pads up" orientation, related electronics can be printed or otherwise formed to couple contact pads of the die to related electronics of the tag substrate.

In an alternative aspect, the dies may be transferred between surfaces in a "pads down" orientation. When dies are transferred to a substrate in a "pads down" orientation, related electronics can be pre-printed or otherwise pre-deposited on the tag substrates.

In an aspect, the operation of the electronic devices is authenticated. When a device is not operating properly, the location of the device is indicated. In one aspect, ink is applied to the substrate including the die not operating properly.

In an aspect, a far field read of each RFID tag device is performed to authenticate the operation of each RFID tag. The far field read may be performed using an antenna.

These and other advantages and features will become readily apparent in view of the following detailed description of the invention.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 5 is a view of a wafer having separated dies affixed to a support surface.

Figure 1A:
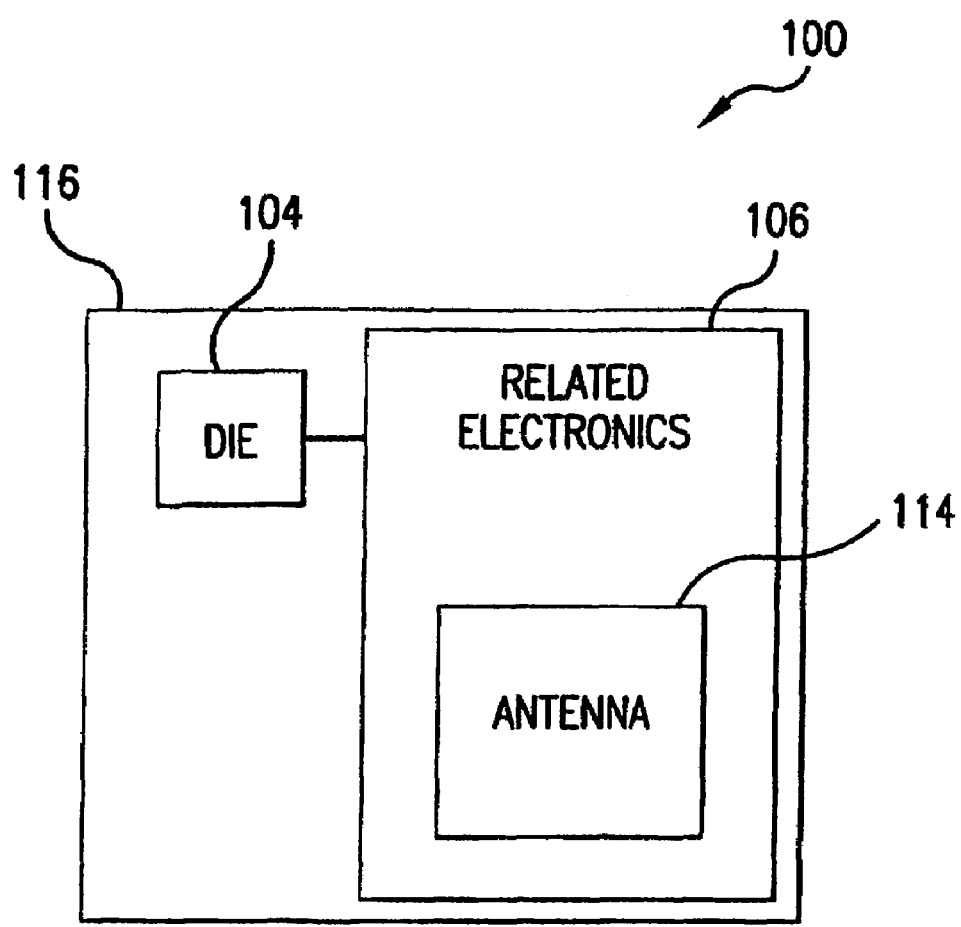
FIG. 1A shows a block diagram of an exemplary RFID tag, according to an embodiment of the present invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

1. Overview

The present invention provides improved processes and systems for assembling electronic devices, including RFID tags. The present invention provides improvements over current processes. Conventional techniques include vision-based systems that pick and place dies, one at a time, onto substrates. The present invention can transfer multiple dies simultaneously. Vision-based systems are limited as far as the size of dies that may be handled, such as being limited to dies larger than 600 microns square. The present invention is applicable to dies 100 microns square and even smaller. Furthermore, yield is poor in conventional systems, where two or more dies may be accidentally picked up at a time, causing losses of additional dies. The present invention allows for improved yield values.

The present invention provides an advantage of simplicity. Conventional die transfer tape mechanisms may be used by the present invention. Furthermore, much higher fabrication rates are possible. Current techniques process 5-8 thousand units per hour. The present invention can provide improvements in these rates by a factor of N. For example, embodiments of the present invention can process dies 5 times as fast as conventional techniques, at 100 times as fast as conventional techniques, and at even faster rates. Furthermore, because the present invention allows for flip-chip die attachment techniques, wire bonds are not necessary.

Elements of the embodiments described herein may be combined in any manner. Example RFID tags are described in section 1.1. Assembly embodiments for electronic devices are described in section 1.2.

1.1 Exemplary Electronic Device

The present invention is directed to techniques for producing electronic devices, such as RFID tags. For illustrative purposes, the description herein primarily relates to the production of RFID tags. However, the invention is also adaptable to the production of further electronic device types, as would be understood by persons skilled in the relevant art(s) from the teachings herein.

Figure 1B:
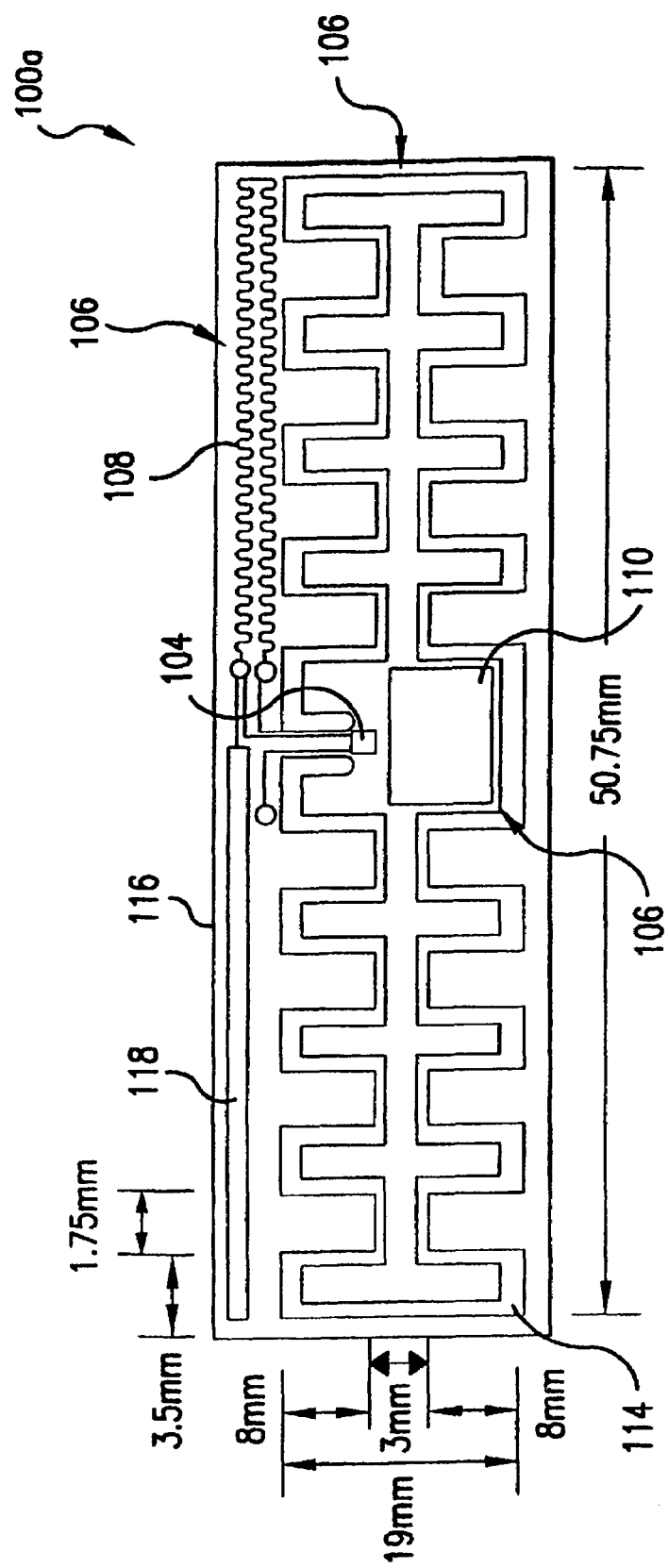
FIGS. 1B and 1C show detailed views of exemplary RFID tags, according to embodiments of the present invention.
Figure 1C:
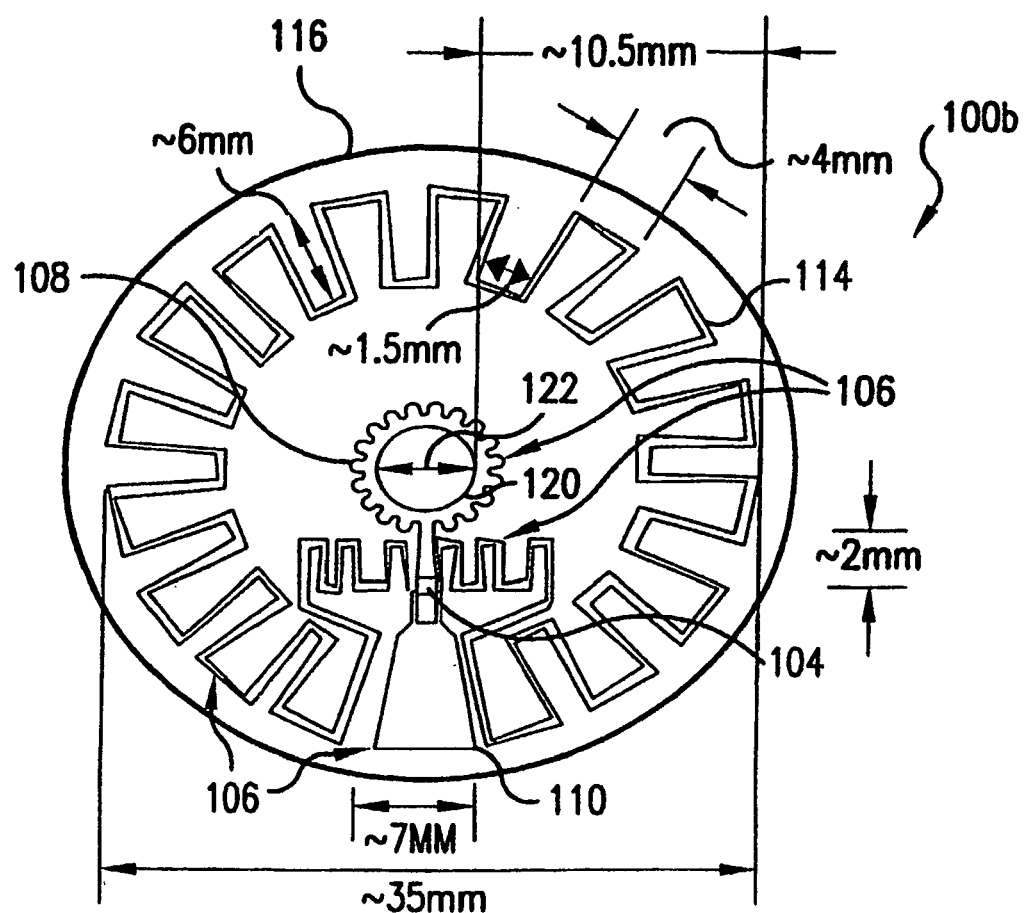

FIG. 1A shows a block diagram of an exemplary RFID tag 100, according to an embodiment of the present invention. As shown in FIG. 1A, RFID tag 100 includes a die 104 and related electronics 106 located on a tag substrate 116. Related electronics 106 includes an antenna 114 in the present example. FIGS. 1B and 1C show detailed views of exemplary RFID tags 100, indicated as RFID tags 100a and 100b. As shown in FIGS. 1B and 1C, die 104 can be mounted onto antenna 114 of related electronics 106. As is further described elsewhere herein, die 104 may be mounted in either a pads up or pads down orientation.

FIG. 1B depicts an exemplary tag 100A having a rectangular substrate 116. As shown in FIG. 1B, the exemplary antenna 114 on substrate 116 extends for 50.75 mm in the x direction and 19 mm in the y direction. As would be appreciated by persons skilled in the art, different dimensions and configurations can be used for antenna 114 and substrate 116.

FIG. 1C depicts an exemplary tag 100B having a circular substrate 116. Exemplary antenna 114 on substrate 116 also has a substantially circular geometry. As shown in FIG. 1C, exemplary antenna 114 fits within a circle having a diameter of approximately 35 mm.

RFID tag 100, such as the exemplary tags shown in FIGS. 1A-1C, may be located in an area having a large number, population, or pool of RFID tags present. RFID tag 100 receives interrogation signals transmitted by one or more tag readers. According to interrogation protocols, RFID tag 100 responds to these signals. Each response includes information that identifies the corresponding RFID tag 100 of the potential pool of RFID tags present. Upon reception of a response, the tag reader determines the identity of the responding tag, thereby ascertaining the existence of the tag within a coverage area defined by the tag reader.

RFID tag 100 may be used in various applications, such as inventory control, airport baggage monitoring, as well as security and surveillance applications. Thus, RFID tag 100 can be affixed to items such as airline baggage, retail inventory, warehouse inventory, automobiles, compact discs (CDs), digital video discs (DVDs), video tapes, and other objects. RFID tag 100 enables location monitoring and real time tracking of such items.

In the present embodiment, die 104 is an integrated circuit that performs RFID operations, such as communicating with one or more tag readers (not shown) according to various interrogation protocols. Exemplary interrogation protocols are described in U.S. Pat. No. 6,002,344 issued Dec. 14, 1999 to Bandy et al. entitled System and Method for Electronic Inventory, and U.S. patent application Ser. No. 10/072,885, filed on Feb. 12, 2002, both of which are incorporated by reference herein in its entirety. Die 104 includes a plurality of contact pads that each provide an electrical connection with related electronics 106.

Related electronics 106 are connected to die 104 through a plurality of contact pads of IC die 104. In embodiments, related electronics 106 provide one or more capabilities, including RF reception and transmission capabilities, sensor functionality, power reception and storage functionality, as well as additional capabilities. The components of related electronics 106 can be printed onto a tag substrate 116 with materials, such as conductive inks. Examples of conductive inks include silver conductors 5000, 5021, and 5025, produced by DuPont Electronic Materials of Research Triangle Park, N.C.

Other materials or means suitable for printing related electronics 106 onto tag substrate 116 include polymeric dielectric composition 5018 and carbon-based PTC resistor paste 7282, which are also produced by DuPont Electronic Materials of Research Triangle Park, N.C. Other materials or means that may be used to deposit the component material onto the substrate would be apparent to persons skilled in the relevant art(s) from the teachings herein.

As shown in FIGS. 1A-1C, tag substrate 116 has a first surface that accommodates die 104, related electronics 106, as well as further components of tag 100. Tag substrate 116 also has a second surface that is opposite the first surface. An adhesive material or backing can be included on the second surface. When present, the adhesive backing enables tag 100 to be attached to objects, such as books and consumer products. Tag substrate 116 is made from a material, such as polyester, paper, plastic, fabrics such as cloth, and/or other materials such as commercially available Tyvec®.

In some implementations of tags 100, tag substrate 116 can include an indentation, "cavity," or "cell" (not shown in FIGS. 1A-1C) that accommodates die 104. An example of such an implementation is included in a "pads up" orientation of die 104.

Figure 2B:
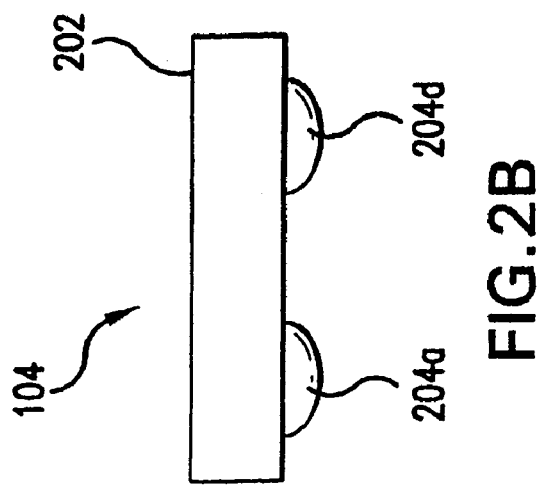
FIGS. 2A and 2B show plan and side views of an exemplary die, respectively.
Figure 2A:
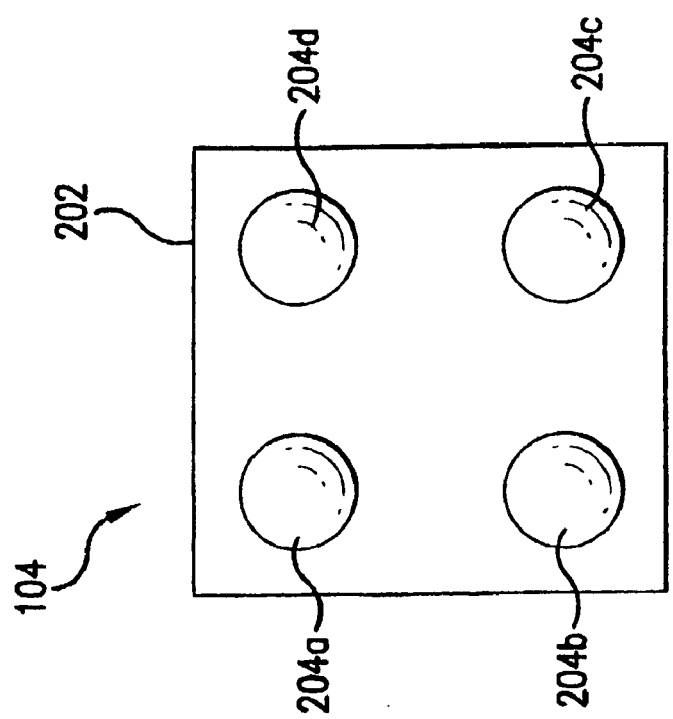

FIGS. 2A and 2B show plan and side views of an example die 104. Die 104 includes four contact pads 204a-d that provide electrical connections between related electronics 106 (not shown) and internal circuitry of die 104. Note that although four contact pads 204a-d are shown, any number of contact pads may be used, depending on a particular application. Contact pads 204 are made of an electrically conductive material during fabrication of the die. Contact pads 204 can be further built up if required by the assembly process, by the deposition of additional and/or other materials, such as gold and solder flux. Such post processing, or "bumping," will be known to persons skilled in the relevant art(s).

Figure 2C:
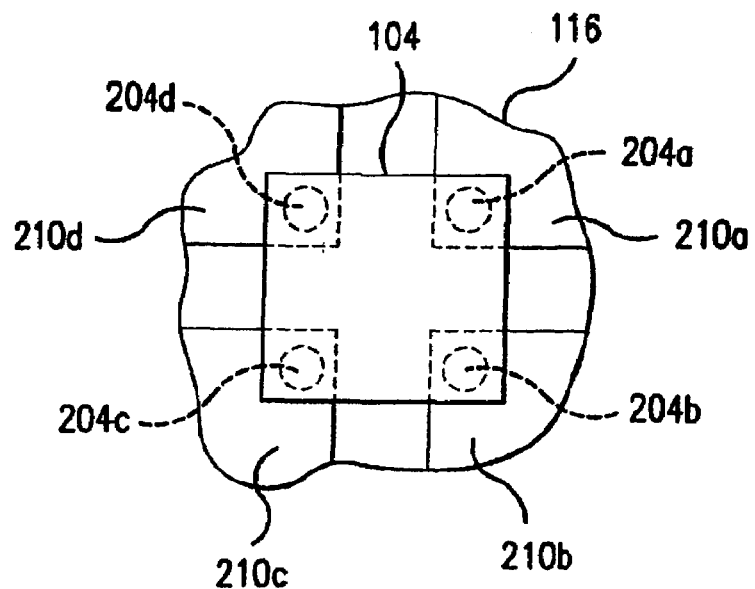
FIGS. 2C and 2D show portions of a substrate with a die attached thereto, according to example embodiments of the present invention.
Figure 2D:
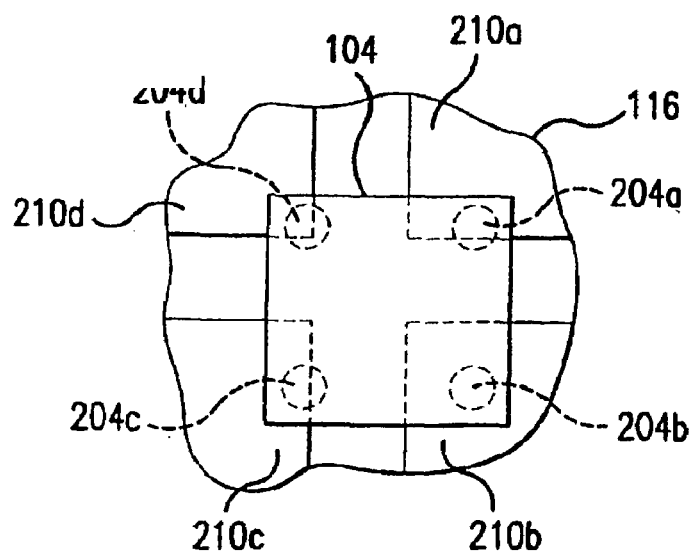

FIG. 2C shows a portion of a substrate 116 with die 104 attached thereto, according to an example embodiment of the present invention. As shown in FIG. 2C, contact pads 204a-d of die 104 are coupled to respective contact areas 210a-d of substrate 116. Contact areas 210a-d provide electrical connections to related electronics 106. The arrangement of contact pads 204a-d in a rectangular (e.g., square) shape allows for flexibility in attachment of die 104 to substrate 116, and good mechanical adherement. This arrangement allows for a range of tolerance for imperfect placement of IC die 104 on substrate 116, while still achieving acceptable electrical coupling between contact pads 204a-d and contact areas 210a-d. For example, FIG. 2D shows an imperfect placement of IC die 104 on substrate 116. However, even though IC die 104 has been improperly placed, acceptable electrical coupling is achieved between contact pads 204a-d and contact areas 210a-d.

Note that although FIGS. 2A-2D show the layout of four contact pads 204a-d collectively forming a rectangular shape, greater or lesser numbers of contact pads 204 may be used. Furthermore, contact pads 204a-d may be laid out in other shapes in other embodiments.

1.2 Device Assembly

The present invention is directed to continuous-roll assembly techniques and other techniques for assembling electronic devices, such as RFID tag 100. Such techniques involve a continuous web (or roll) of the material of the substrate 116 that is capable of being separated into a plurality of devices. Alternatively, separate sheets of the material can be used as discrete substrate webs that can be separated into a plurality of devices. As described herein, the manufactured one or more devices can then be post processed for individual use. For illustrative purposes, the techniques described herein are made with reference to assembly of tags, such as RFID tag 100. However, these techniques can be applied to other tag implementations and other suitable devices, as would be apparent to persons skilled in the relevant art(s) from the teachings herein.

The present invention advantageously eliminates the restriction of assembling electronic devices, such as RFID tags, one at a time, allowing multiple electronic devices to be assembled in parallel. The present invention provides a continuous-roll technique that is scalable and provides much higher throughput assembly rates than conventional pick and place techniques.

Figure 3:
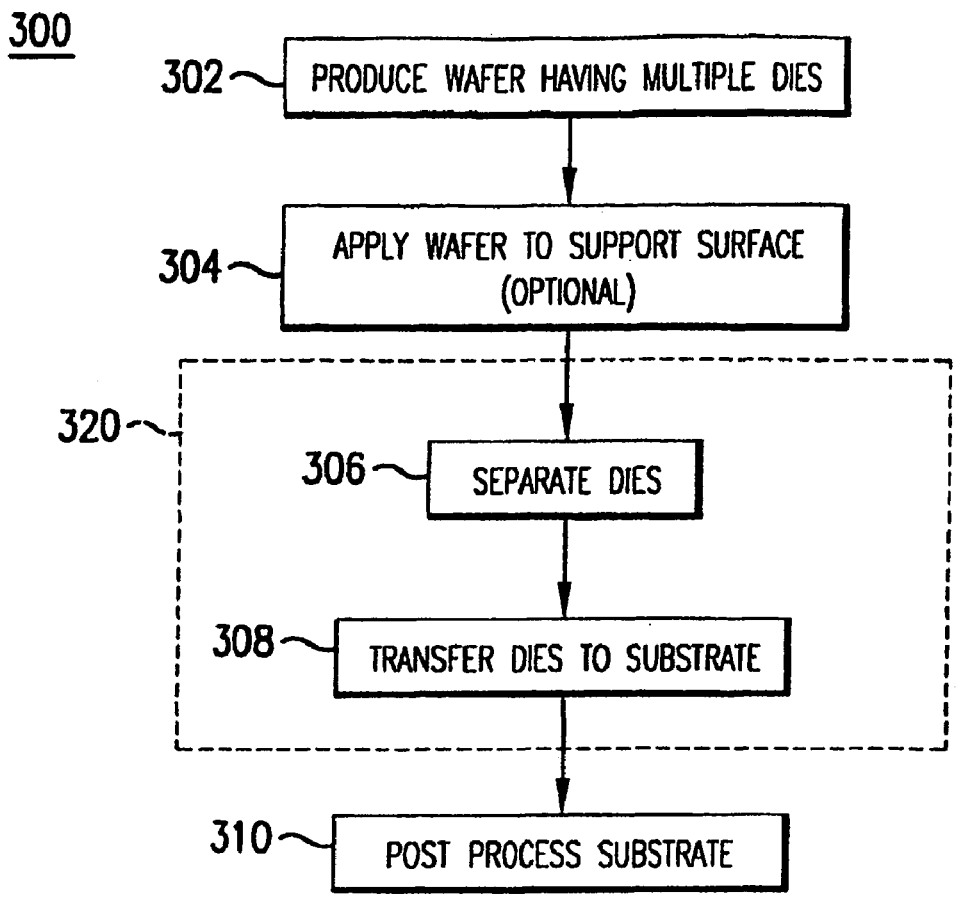
FIG. 3 is a flowchart illustrating a device assembly process, according to embodiments of the present invention.

FIG. 3 shows a flowchart 300 with example steps relating to continuous-roll production of RFID tags 100, according to example embodiments of the present invention. FIG. 3 shows a flowchart illustrating a process 300 for assembling tags 100. The process 300 depicted in FIG. 3 is described with continued reference to FIGS. 4A and 4B. However, process 300 is not limited to these embodiments.

Figure 4A:
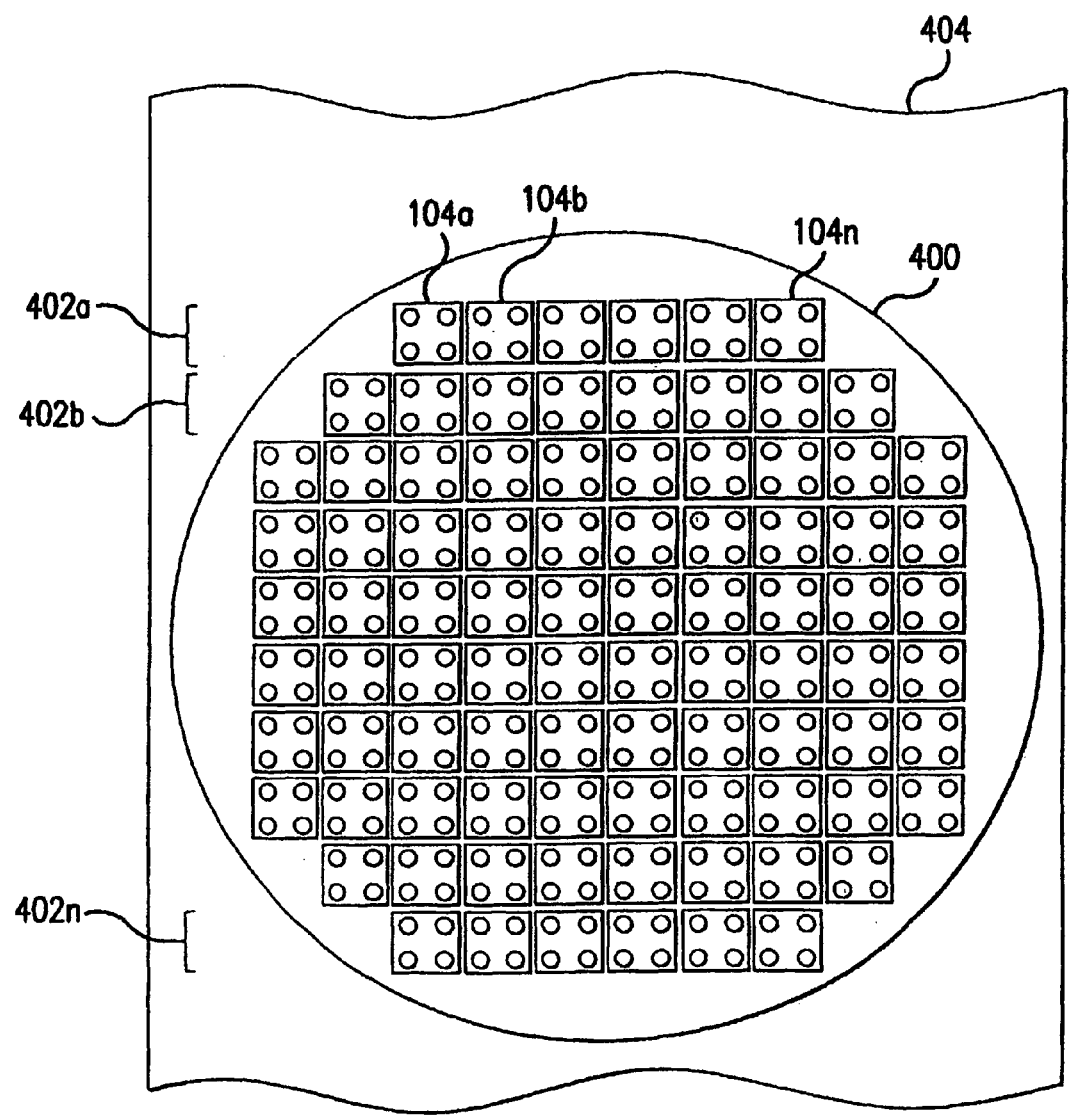
FIGS. 4A and 4B are plan and side views of a wafer having multiple dies affixed to a support surface, respectively.

Process 300 begins with a step 302. In step 302, a wafer 400 (shown in FIG. 4A) having a plurality of dies 104 is produced. FIG. 4A illustrates a plan view of an exemplary wafer 400. As illustrated in FIG. 4A, a plurality of dies 104a-n are arranged in a plurality of rows 402a-n.

Figure 4B:
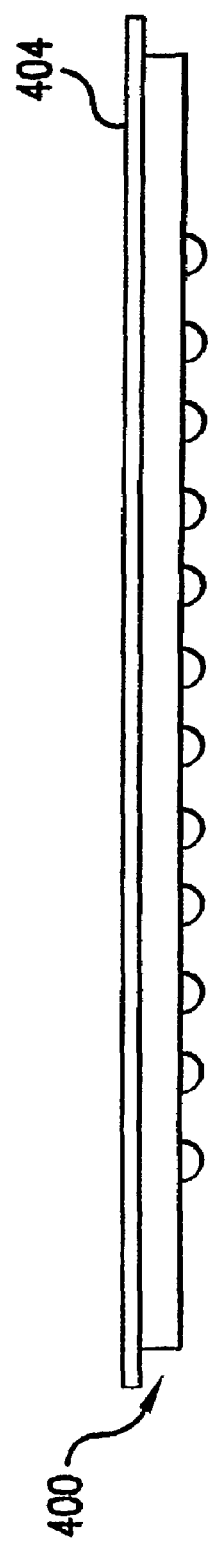

In a step 304, wafer 400 is optionally applied to a support structure or surface 404. Support surface 404 includes an adhesive material to provide adhesiveness. For example, support surface 404 may be an adhesive tape that holds wafer 400 in place for subsequent processing. FIG. 4B shows an example view of wafer 400 in contact with an example support surface 404. In some embodiments, wafer 400 is not attached to a support surface, and can be operated on directly.

In a step 306, the plurality of dies 104 on wafer 400 are separated. For example, step 306 may include scribing wafer 400 according to a process, such as laser etching. FIG. 5 shows a view of wafer 400 having example separated dies 104 that are in contact with support surface 404. FIG. 5 shows a plurality of scribe lines 502a-l that indicate locations where dies 104 are separated.

In a step 308, the plurality of dies 104 is transferred to a substrate. For example, dies 104 can be transferred from support surface 404 to substrates 116. Alternatively, dies 104 can be directly transferred from wafer 400 to substrates 116. In an embodiment, step 308 may allow for "pads down" transfer. Alternatively, step 308 may allow for "pads up" transfer. As used herein the terms "pads up" and "pads down" denote alternative implementations of tags 100. In particular, these terms designate the orientation of connection pads 204 in relation to tag substrate 116. In a "pads up" orientation for tag 100, die 104 is transferred to tag substrate 116 with pads 204a-204d facing away from tag substrate 116. In a "pads down" orientation for tag 100, die 104 is transferred to tag substrate 116 with pads 204a-204d facing towards, and in contact with tag substrate 116.

Note that step 308 may include multiple die transfer iterations. For example, in step 308, dies 104 may be directly transferred from a wafer 400 to substrates 116. Alternatively, dies 104 may be transferred to an intermediate structure, and subsequently transferred to substrates 116. Example embodiments of such die transfer options are described below in reference to FIGS. 6-8.

Note that steps 306 and 308 can be performed simultaneously in some embodiments. This is indicated in FIG. 3 by step 320, which includes both of steps 306 and 308.

Example embodiments of the steps of flowchart 300, are described in co-pending applications, "Method and Apparatus for Expanding a Semiconductor Wafer," "Method, System, and Apparatus for Transfer of Dies Using a Die Plate Having Die Cavities," "Method, System, and Apparatus for Transfer of Dies Using a Die Plate," "Method, System, and Apparatus for Transfer of Dies Using a Pin Plate," and "Method, System, and Apparatus for High Volume Transfer of Dies," each of which is herein incorporated by reference in its entirety.

In a step 310, post processing is performed. For example, during step 310, assembly of device(s) 100 is completed.

2. Device Authentication

2.1 System Architecture

Figure 6:
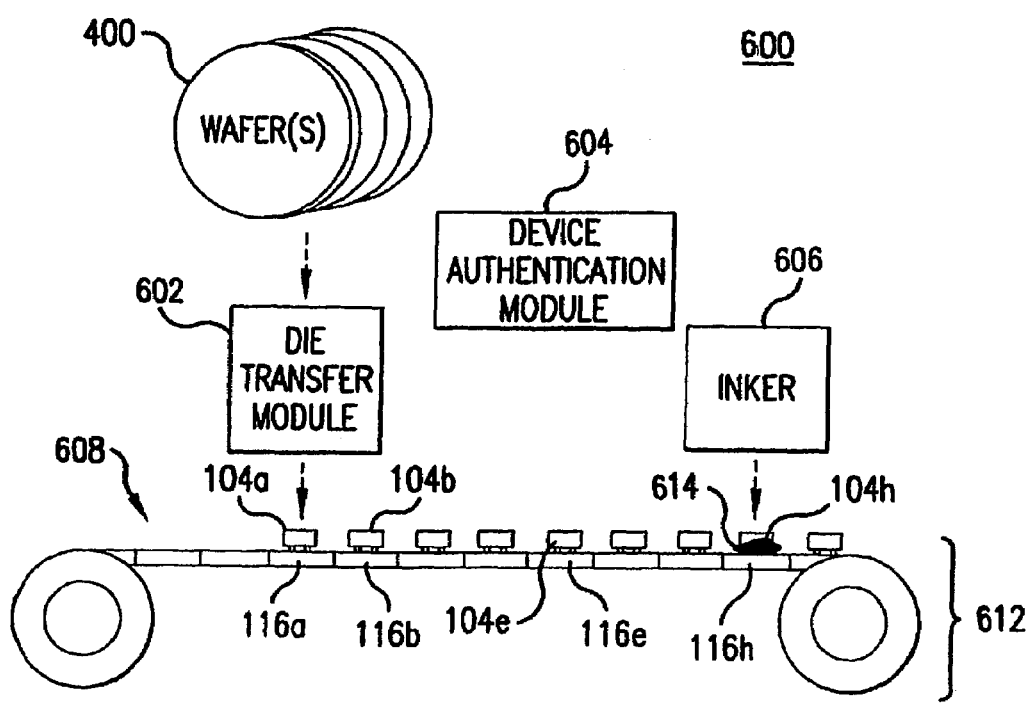
FIG. 6 shows a device assembly system with device authentication, according to an example embodiment of the present invention.

During the device assembly process, the operation of assembled devices may be authenticated. In other words, as devices are manufactured, they may be checked to determine whether they are operating properly. For example, FIG. 6 shows a simplified device assembly system 600 with device authentication, according to an example embodiment of the present invention. System 600 illustrates an example process for creating devices, authenticating devices, and providing an indication of defectively manufactured devices. System 600 includes a die transfer module 602, a device authentication module 604, an optional inker 606, and a substrate conveyor system 612.

System 600 receives wafers 400 or other surfaces or containers having a plurality of dies. Each die has a unique wafer identification number that is programmed in memory on each die. The wafer identification numbers are unique within a wafer. The wafer identification number is used to track the die during the assembly process and/or during post processing. In addition, the wafer identification number is used during die/device authentication.

Figure 7:
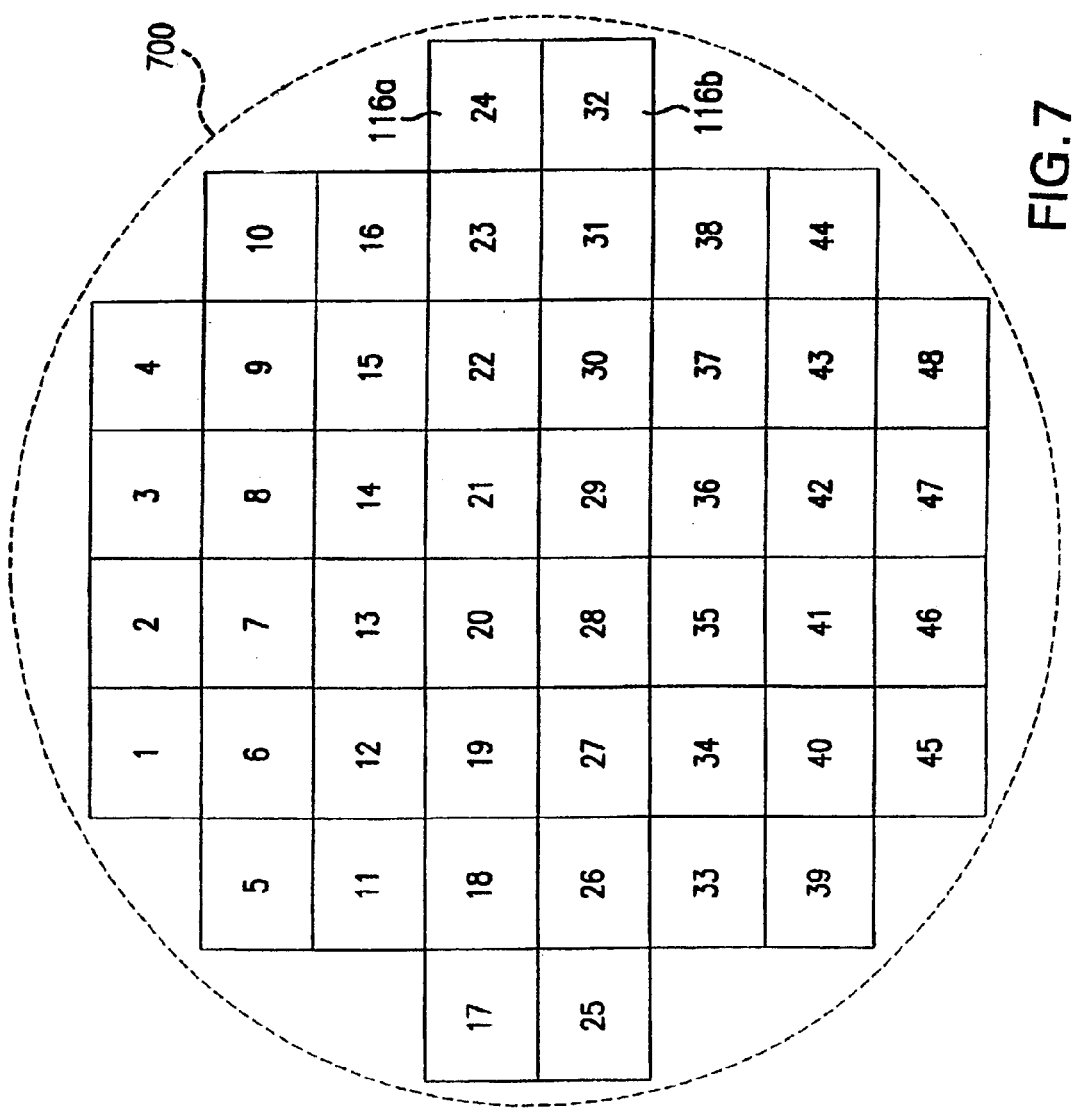
FIG. 7 shows an example wafer having 48 dies, with wafer identification numbers 1-48, according to embodiments of the present invention.

In an embodiment, the wafer identification number is a die identification number (e.g., tag ID) that is unique among dies in a lot of dies located on multiple wafers. Alternatively, the wafer identification number may be a smaller number that is unique only to dies within a single wafer. In an embodiment, the wafer identification number is stored in memory (e.g., ROM) on the die. In applications where the die identification number is not programmed on the die during wafer manufacture, a smaller number, the wafer identification number, is stored in ROM on the die. Thus, the number of bits required to uniquely identify a die on wafer is related to the number of dies on the wafer and/or the application. FIG. 7 shows an example wafer 700 having 48 dies, with wafer identification numbers 1-48.

For each wafer entering system 600, each die is identifiable and the location of each die is know. For example, a wafer map indicating the location of each die on the wafer may be maintained, stored, or other recorded. In the wafer map, each wafer identification number is correlated with its location on the die (also referred to as "geolocation"). System 600 stores the wafer map for each wafer being processed. In an alternate embodiment, system 600 accesses an external system for the wafer map when required during processing.

Substrate conveyor system 612 conveys a continuous web 608 of substrates 116, to which dies 104 can be attached in large quantities. Web 608 can be a continuous roll of substrates 116, or can be discrete, separate sheets of substrates 116. Substrate conveyor system 612 typically moves the web of substrates in increments related to the substrate size.

Die transfer module 602 transfers dies 104 from received wafers 400 onto the substrates 116 of web 608. Die transfer module 602 can include any of the structures and processes described herein or in the referenced applications for transferring dies from wafers to substrates. For example, the die transfer module can include any of the structures and operations for transferring dies from wafers directly to substrates, for transferring dies from wafers to intermediate surfaces, and for transferring dies from intermediate surfaces to substrates. For example, die transfer module 602 may perform the steps 304, 306, and/or 308, shown in FIG. 3. As shown in FIG. 6, die transfer module 602 receives one or more wafers 400, and transfers dies 104 to substrates 116 of web 608. For more information on transfer of dies to substrates, see co-pending applications, "Method, System, and Apparatus for Transfer of Dies Using a Pin Plate", and "Method, System, and Apparatus for High Volume Transfer of Dies,".

System 600 tracks the location of each die transferred from the wafer onto a substrate. As described above, using the wafer map, system 600 can determine the location of each die within a wafer. System 600 tracks the location of the wafer in the system. Furthermore, system 600 tracks which dies are transferred to which substrates in web 608. Therefore, for each transfer step, system 600 knows the dies being transferred and the location of the substrates receiving each die.

In addition, system 600 tracks the location of substrates of substrate web 608. For example, the location of the substrates in the system can be determined because the system moves the substrate web incrementally. For example, the location of a substrate can be tracked by an increment count (e.g., number of increments the substrate web is moved forward after transfer of the die to the substrate) or by an elapsed time since transfer.

Figure 8:
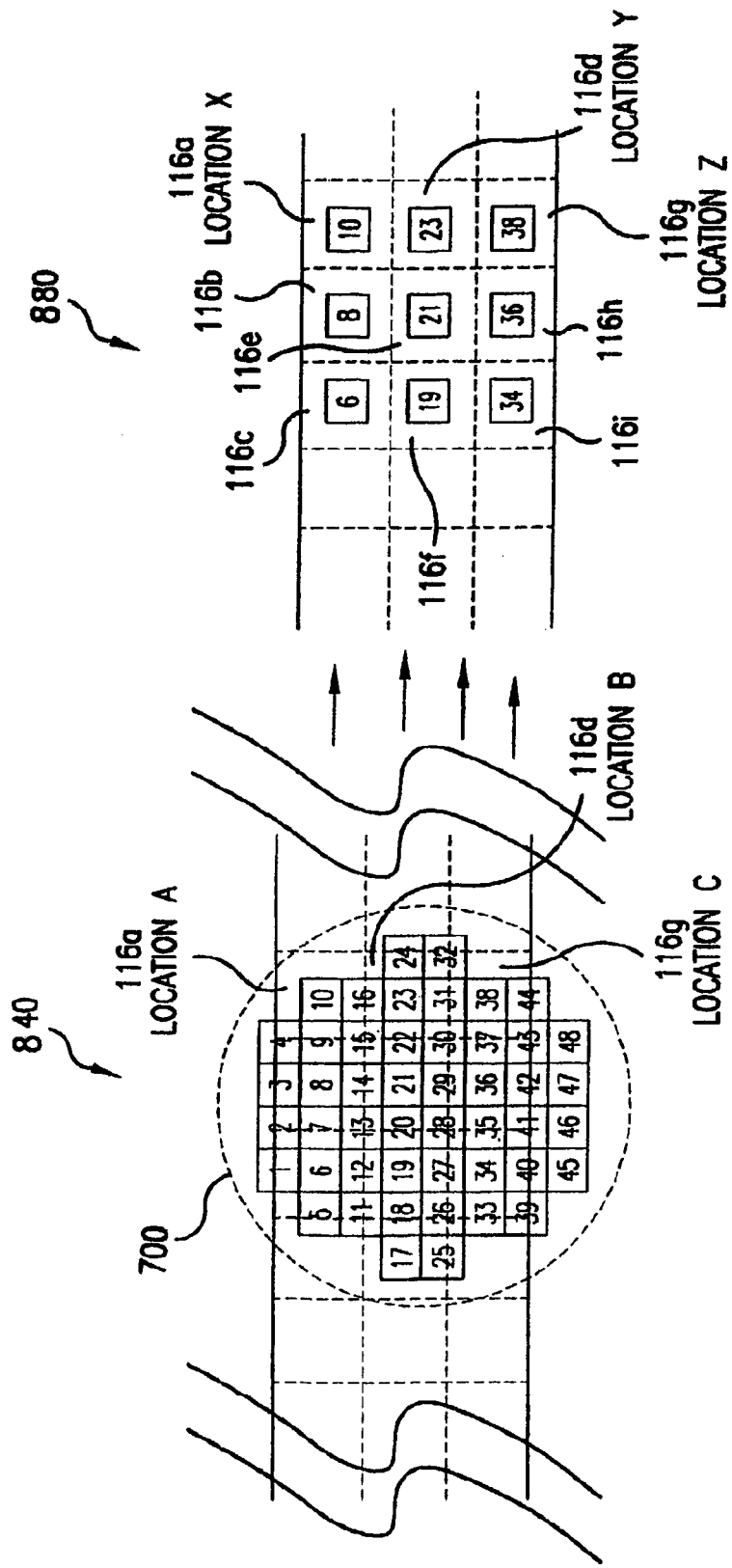
FIG. 8 shows an exemplary portion of a substrate web having dies from the wafer of FIG. 7 attached thereto, according to example embodiments of the present invention.

For example, FIG. 8 shows the location of a plurality of dies from wafer 700. The location of wafer 700 relative to substrate web 608 prior to die transfer is shown as location 840. In the example of FIG. 8, nine dies are transferred simultaneously in a 3×3 array. As shown in location 840, die 10 is positioned adjacent to substrate 116a; die 23 is positioned adjacent to substrate 116d, etc. In addition, as shown at location 840, when dies are transferred, substrate 116a is at location A; substrate 116*d* is at location B; and substrate 116*g* is at location C. As further is shown in 840, dies 1-4, 5, 7, 9, 11-16, 17, 18, 20, 22, 24, 25-32, 33, 35, 37, and 39-48 are not transferred in this iteration. After die transfer, substrate web 608 is moved in a predetermined increment or increments (e.g., to expose the next 3×3 array of substrates to dies remaining in wafer 700). The location of the substrate web after the substrate web is incremented is shown as location 880. As shown in location 880, die 10 is located on substrate 116*a* which is at location X; die 23 is located on substrate 116*d* which is at location Y, die 38 is located on substrate 116*g* which is at location Z, etc.

System 600 may track the location of dies/devices in system 600 during the assembly process. In addition or alternatively system 600 may calculate the location of one or more devices in system 600 at a specific time using known information. In an embodiment, die/device location information is stored (or tracked) locally in system 600. In addition or alternatively location information is stored (or tracked) in an external system.

For example, a die/device identifier (e.g., wafer identification number) is stored and correlated with the time or increment when the die was transferred to a substrate. In addition, or alternatively, a specific substrate or substrate location may be stored and correlated with the die/device identifier. The system then tracks the time/increments as the substrate web is moved through the system. The location of a die/device at a specific point during the process can be calculated using the difference between the current increment/time and the increment/time of transfer. This difference can be used to identify the location of the substrate containing the die/device in the system.

In an embodiment, location information is continually or periodically updated for each die/device as the die/device moves through system 600. For example, each time the substrate web is incremented, the location information for the die/device in the system is updated.

Note that information regarding the location of a device in the system may be tracked or calculated for each device during the assembly process. Alternatively, device location may be calculated only for defective devices.

Furthermore, as shown in FIG. 6, after dies are applied to substrates to create devices, operation of the devices is verified by the device authentication module 604. For example, when the devices are RFID tags, the device authentication module 604 includes an antenna. During authentication, the antenna 604 performs a read of the tags that have been assembled to verify whether the tags are operating properly. For example, antenna 604 transmits a signal that is received by tags that have been assembled. For example, die 104*e* on substrate 116*e* forms an assembled tag. If operating properly, the assembled tag responds to the signal. Using any appropriate communication protocol, antenna 604 transmits the tag's identification number stored within the tag, and if the tag is operating properly, the tag will respond. If the tag is not operating properly, the tag will not respond.

In a preferred embodiment, during tag assembly, an antenna in the device authentication module 604 performs a "far field" read of assembled tags. Alternatively, a "near field" read can be performed. A space or region immediately surrounding an antenna, in which reactive components predominate, is known as the reactive near field region. The size of this region varies for different antennas. For most antennas, however, the outer limit of a near field read is on the order of a few wavelengths or less. Beyond the reactive near field region, the "radiating field" predominates. The radiating region is divided into two sub-regions, the "radiating near field" region and the "far field" region. In the radiating near field region, the relative angular distribution of the field (the usual radiation pattern) is dependent on the distance from the antenna. In a far field region, the relative angular distribution of the field becomes independent of the distance. According to the present invention, a read using the far field region is utilized, as a far field read.

An advantage of using the far field region, according to the present invention, is that one or a small number of antennas can be used to verify operation of a large number of assembled tags. This contrasts with using a near field region, in which a radiating element must be applied to each tag under test in close proximity. Thus, in a near field read, a large number of radiating elements is required, while in a far field read, a small number of radiating elements is required. Note, however, in alternative embodiments, the near field regions may be used to verify operation of assembled tags.

System 600 identifies the location in the system of each device not operating properly. As a result of the device authentication process, device authentication module 604 knows the wafer identification number of each device not operating properly. In an embodiment, system 600 uses the wafer identification number to access location information to identify the location of defective devices.

In an embodiment, location information for each die/device is tracked by the system during the assembly process. Thus, no additional calculation is required. Alternatively, the location of the defective device is calculated using known data, as described above.

In an embodiment, the identification of the location of a defective device in the system is performed by the device authentication module. In an alternative embodiment, the identification of the location of a defective device in the system is performed by the inker or similar indication apparatus.

Devices that the device authentication module 604 determines are not operating correctly must be indicated. For example, tags that do not respond to the read performed by an antenna in the device authentication module 604 are indicated. Such devices are indicated because they are defective (e.g., do not meet defined operating parameters), and must be rejected. A variety of methods may be used to keep track of such defective tags. For example, in an embodiment, as shown in FIG. 6, an inker 606 may be used to mark defective devices. For example, as shown in FIG. 6, inker 606 has marked a device that includes die 104*h* and substrate 116*h*, with a mark 614. Mark 614 may be an ink material, or other marking material, to make a defective device apparent on web 608. Mark 614 makes a defective device readily identifiable, and the device can be disposed of.

In an alternative embodiment, an inker 606 is not present. Instead, the identification and/or locations of defective devices on web 608 and/or in system 600 are stored by a computer system. The defective tag can then later be located and disposed of, using the stored location of the device. This is possible, as the wafer identification numbers stored in dies 104 are known prior to being attached to substrates 116. Furthermore, the location in web 608 of each substrate 116 to which a die 104 is attached is known. Thus, the defective tags can be located in web 608.

2.2 Method for Authenticating Devices

Figure 9:
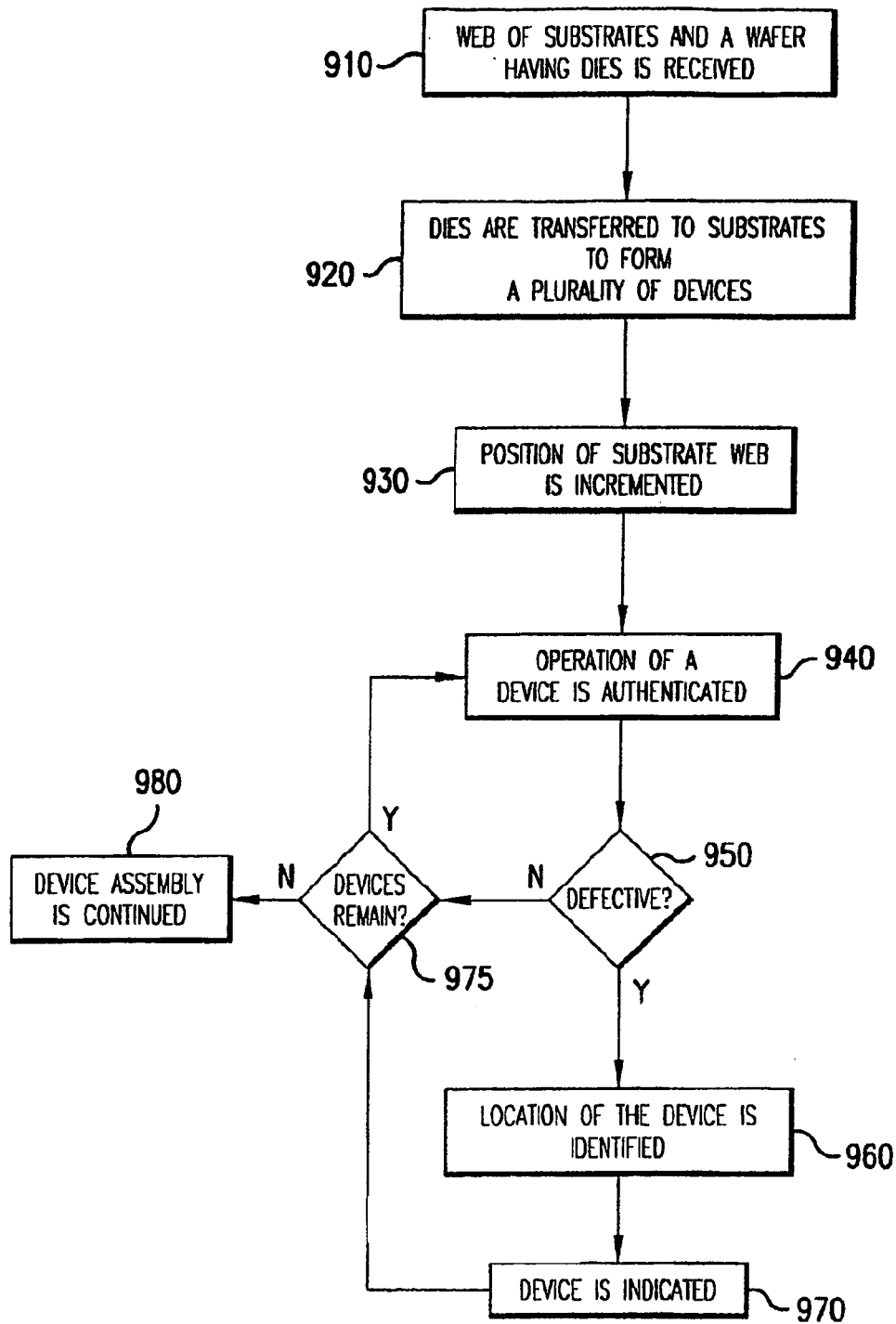
FIG. 9 shows a flowchart providing steps for authenticating devices, according to embodiments of the present invention.

FIG. 9 shows a flowchart 900 including example steps for authenticating one or more assembled devices during the assembly process, as described above, according to embodiments of the present invention. Further operational and structural embodiments of the present invention will be apparent to persons skilled in the relevant arts based on flowchart 900. Note that ways of tracking or indicating defective devices, other than described above, are applicable to the present invention.

Flowchart 900 begins at step 910 when a web of substrates and a wafer having dies is received. In an embodiment, a wafer map associated with the wafer is also received. Alternatively, a wafer map is generated by system 600 or accessed from an external system when required during assembly process.

In step 920, dies from the wafer are transferred to substrates on the web to form a plurality of devices.

In step 930, the web is moved incrementally.

In step 940, the operation of a device is authenticated. For example, if the device is an RFID tag, a far field read of the RFID tag is performed.

In step 950, a determination is made whether the die/device was found to be defective (e.g., device not operating properly) during step 940. If the device is defective, operation proceeds to step 960. Otherwise, operation proceeds to step 975. For example, when the device is an RFID tag, a device that does not respond to the far field read is considered defective.

In step 960, the location of the device is identified. For example, the wafer identification number of the defective device is known. In an example embodiment, the location of each die/device during the assembly process may be tracked and/or calculated and stored internally or externally to system 600. In this exemplary embodiment, in step 960, the wafer identification number is used to access the location information for that die/device on the substrate. In an additional exemplary embodiment, in step 960, the location of the defective die is calculated in real-time using available data.

In step 970, the device that is not working properly is indicated. For example, the defective device is marked with ink.

In step 975, a determination is made whether any devices remain to be authenticated. If a device remains to be authenticated, operation proceed to step 940. Steps 940-975 are repeated for each device to be authenticated. Otherwise, operation proceeds to step 980.

In step 980, the assembly process is continued. For example, if dies on the wafer remain to be transferred, operation may proceed to step 920. If no dies remain on the wafer, operation may proceed to step 910.

Note that several steps in flowchart 900 may occur in parallel. For example, a plurality of devices could be authenticated (e.g., steps 940-975) at substantially the same time as a plurality of dies is being transferred to substrates (e.g., step 920).

3.0 Conclusion

While various embodiments of the present invention have been described above, it should be understood that they have been presented by way of example, and not limitation. It will be apparent to persons skilled in the relevant arts that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A method for authenticating the operation of a plurality of RFID devices, comprising:
   (A) receiving a web having a plurality of substrates and a wafer having a plurality of dies;
   (B) transferring dies to substrates of the web to form a plurality of RFID devices;
   (C) generating position data for at least one of the plurality of RFID devices;
   (D) authenticating the operation of the plurality of RFID devices through a read operation;
   (E) identifying one or more RFID devices which did not respond during the read operation; and
   (F) locating the one or more non-responsive RFID devices based on an identification number of the non-responsive RFID device and the generated position data for the non-responsive RFID device.

2. The method of claim 1, wherein step (F) comprises: applying ink to the substrate containing the non-responsive RFID device.

3. The method of claim 1, wherein step (F) comprises: storing the location information associated with the non-responsive RFID device.

4. The method of claim 1, wherein step (C) comprises: generating position data for the at least one RFID device during movement of the web.

5. The method of claim 1, wherein the step of locating the one or more non-responsive RFID devices comprises:
   determining an identification number associated with the non-responsive RFID device; and
   using the identification number to access generated position data associated with the non-responsive RFID device.

6. The method of claim 1, wherein the step of locating the one or more non-responsive RFID devices comprises:
   determining an identification number associated with the device; and
   calculating location information.

7. A method for authenticating the operation of a plurality of devices, comprising:
   (A) receiving a web having a plurality of substrates and a wafer having a plurality of dies;
   (B) transferring dies to substrates of the web to form a plurality of devices;
   (C) authenticating the operation of a device of the plurality of devices; and
   (D) if the operation of the device does not authenticate properly in step (C), identifying a location of the device, wherein step (D) includes:
   determining the location of the device on the web of substrates using the identification number;
   determining the time when the device was transferred;
   using the difference between the current time and the time when the device was transferred to identify the present location of the device in the system.

8. A method for authenticating the operation of a plurality of devices, comprising:
   (A) receiving a web having a plurality of substrates and a wafer having a plurality of dies;
   (B) transferring dies to substrates of the web to form a plurality of devices;
   (C) authenticating the operation of a device of the plurality of devices; and
   (D) if the operation of the device does not authenticate properly in step (C), identifying a location of the device, wherein step (D) includes:

determining the location of the device on the web of substrates using the identification number;
determining a count when the device was transferred; and
using the difference between a present count and the count when the device was transferred to identify the present location of the device in the system.

9. The method of claim 1, wherein step (D) comprises:
performing a far field read of the plurality of RFID tags being authenticated.

10. The method of claim 1, where step (A) comprises:
receiving a web of substrates having a width of a single substrate.

11. The method of claim 1, where step (A) comprises:
receiving a web of substrates having a width of multiple substrates.

12. A method for authenticating the operation of a device, comprising:
(A) receiving a web of substrates;
(B) receiving a wafer;
(C) transferring a die from the wafer to a substrate of the web to form a device;
(D) storing a first time at which the device is formed;
(E) tracking movement of the device with the web;
(F) testing the device;
(G) the device fails the test of step (F), storing a second time at which the device is determined to have failed the test of step (F); and
(H) determining a location of the device based on the difference between the first time and the second time.

13. The method of claim 12, further comprising:
marking the determined location of the device in the web to indicate the device has failed.

14. A method for authenticating the operation of a device, comprising:
(A) receiving a web of substrates;
(B) receiving a wafer;
(C) transferring a die from the wafer to a substrate of the web to form a device;
(D) storing a position in the web at which the device is formed;
(E) tracking movement of the device with the web;
(F) testing the device;
(G) if the device fails the test of step (F), storing a number of increments of the movement of the web until the device is determined to have failed the test of step (F); and
(H) determining a location of the device based on the stored position and the stored increments of the movement of the web.

15. The method of claim 14, further comprising:
marking the determined location of the device in the web to indicate the device has failed.

16. The method of claim 1, wherein step (C) includes:
determining the location of the device on the web of substrates using the identification number;
determining the time when the device was transferred; and
using the difference between the current time and the time when the device was transferred to identify the present location of the device in the system.

17. The method of claim 1, wherein step (C) includes:
determining the location of the device on the web of substrates using the identification number;
determining a count when the device was transferred; and
using the difference between a present count and the count when the device was transferred to identify the present location of the device in the system.

* * * * *

UNITED STATES PATENT AND TRADEMARK OFFICE
CERTIFICATE OF CORRECTION

PATENT NO. : 7,276,388 B2 Page 1 of 1
APPLICATION NO. : 10/866152
DATED : October 2, 2007
INVENTOR(S) : Arneson et al.

It is certified that error appears in the above-identified patent and that said Letters Patent is hereby corrected as shown below:

In Claim 12, Column 13, Line 29, please delete "(G) the device fails the test..." and replace with --(G) if the device fails the test...--.

Signed and Sealed this

Twenty-ninth Day of April, 2008

JON W. DUDAS
*Director of the United States Patent and Trademark Office*